(12) United States Patent
Zipper et al.

(10) Patent No.: US 7,495,595 B2
(45) Date of Patent: Feb. 24, 2009

(54) ANALOG-TO-DIGITAL CONVERTER, RECEIVER ARRANGEMENT, FILTER ARRANGEMENT AND SIGNAL PROCESSING METHOD

(75) Inventors: Joseph Zipper, Linz (AT); Günther Haberpeuntner, Linz (AT); Hermann Hofer, Linz (AT); Linus Maurer, Linz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/742,307

(22) Filed: Apr. 30, 2007

(65) Prior Publication Data

US 2008/0266161 A1  Oct. 30, 2008

(51) Int. Cl.
*H03M 1/12* (2006.01)
(52) U.S. Cl. .................................. 341/155; 341/143
(58) Field of Classification Search .............. 341/155, 341/143, 144, 172
See application file for complete search history.

(56) References Cited

U.S. PATENT DOCUMENTS 5,963,156 A * 10/1999 Lewicki et al. ............. 341/122
6,040,793 A * 3/2000 Ferguson et al. ............ 341/143
6,169,509 B1 * 1/2001 Abe ........................... 341/150

OTHER PUBLICATIONS

"Charge-Domain Sampling of High-Frequency Signals with Embedded Filtering", Sami Karvonen, PhD Thesis, University of Ouluensis, Finland, 2006, 84 pgs.
"Direct RF Sampling Mixer with Recursive Filtering in Charge Domain", Khurram Muhammad and Robert Bogdan Staszewski, Proceedings of the International Symposium on Circuits and Systems, Vancouver, BC, Canada, 2003, 4 pgs.

* cited by examiner

*Primary Examiner*—Brian Young
(74) *Attorney, Agent, or Firm*—Eschweiler & Associates, LLC (57) ABSTRACT

A filter arrangement comprises a switching element coupled to a filter input, wherein the switching element is controllable by a reference clock signal. The filter arrangement further comprises an input storage element, an output storage element, and a first and a second auxiliary storage element. The first and the second auxiliary storage element can each be connected in parallel to the input storage element or to the output storage element depending on a switching signal. The output storage element is coupled to a filter output. The filter arrangement can be used as a loop filter in an analog-to-digital converter, wherein the output signal of the filter arrangement is quantized to provide an output word. Respective feedback signals can be generated from the output word and be provided to the storage elements.

36 Claims, 6 Drawing Sheets

ANALOG-TO-DIGITAL CONVERTER, RECEIVER ARRANGEMENT, FILTER ARRANGEMENT AND SIGNAL PROCESSING METHOD

BACKGROUND OF THE INVENTION

The requirements for the transmission quality of transmitting and receiving devices become more stringent as the need for high data rates and increasing mobility grows. The modern mobile radio standards, such as Universal Mobile Telecommunications System (UMTS), Wideband Code Division Multiple Access (WCDMA), Global System for Mobile Communication (GSM), Enhanced Data Rates for GSM Evolution (EDGE), Bluetooth Medium Data Rate or Wireless Local Area Network (WLAN) according to 802.11a/e/g/n require special modulation types for data transmission which modulate both the phase and the amplitude of a carrier signal at the same time.

Simultaneous amplitude and phase modulation make it possible to achieve higher data transmission rates and thus better bandwidth efficiency. The mobile radio standards mentioned above envisage, for example, the use of quadrature phase shift keying (QPSK), 8-phase shift keying (8-PSK) or quadrature amplitude modulation (QAM) as modulation types for the data transmission.

In a receiver chain for processing modulated radio frequency signals received, for example, over an antenna, it is desirable to shift as much functionality as possible to the digital domain for reducing costs of analog circuits by using cheaper digital circuits based on CMOS technology. Furthermore, digital blocks can increase the reliability of the receiver chain because of being insensitive to variations of temperature, voltage and manufacturing processes.

An analog-to-digital converter (ADC) to be provided in the receiver chain is required to be working in a respective dynamic range. For example, in communication systems based on $\Sigma\Delta$-ADCs, the achievable dynamic range depends on the quantization noise generated by the converter. This quantization noise can usually be alleviated by increasing respective oversampling ratios or providing high order modulation loops or multibit quantization in the ADC. Additionally, a filter function can be implemented in the signal transfer function of the modulation loop, thus suppressing unwanted frequency portions in the processed signal.

With the growing bandwidth requirements of future communication standards the bandwidths of the ADCs should increase as well. Hence, it is desirable that many different wireless standards can be implemented in the digitally based receiver chain.

Devices optimized for digital circuitry are usually fast at low current densities. If, for higher powers, the respective current density is increased, the speed of these devices, that means the ability to process signals with high frequencies, decreases. Furthermore, it can be difficult to achieve reasonable gain bandwidth products, as transconductance to current ratios and intrinsic gains of respective transistors decrease with decreasing sizes of the used technology.

Conventional $\Sigma\Delta$-ADCs usually comprise high-order loops, for example up to a sixth order loop, and multibit quantizers to reduce quantization noise. The higher order filter structures usually comprise operational amplifiers which limit the use of high clocking rates of the ADC which are needed to achieve a high oversampling ratio. A high oversampling ratio is required to reduce the quantization noise. As mentioned before, this effect becomes more evident with decreasing sizes of CMOS technology.

It is furthermore difficult to design accurate higher order loop filters, as active parts like operational amplifiers are needed. Due to the facts of growing conversion bandwidth, a shrinking technology and a limited transfer bandwidth of these active parts, an appropriate design of the active parts can usually only be achieved by a substantial increase of power consumption in the respective circuits.

Therefore, the use of higher frequency bandwidth in conventional receiver chains is limited, amongst other things, by the use of active parts in the loop filter of an analog-to-digital converter.

BRIEF DESCRIPTION OF THE DRAWINGS

The invention is explained in detail below using exemplary embodiments with reference to the drawings in which.

DETAILED DESCRIPTION OF THE INVENTION

In the following description further aspects and embodiments of the present invention are disclosed. In addition, reference is made to the accompanying drawings, which form a part thereof, and in which is shown by way of illustration, one or more examples in which the invention may be practiced. The embodiments herein provide a better understanding of one or more aspects of the present invention. This disclosure of the invention is not intended to limit the features or key-elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made without departing from the scope of the present invention. The elements of the drawing are not necessarily to scale relative to each other. Like reference numerals designate corresponding similar parts.

Figure 1:
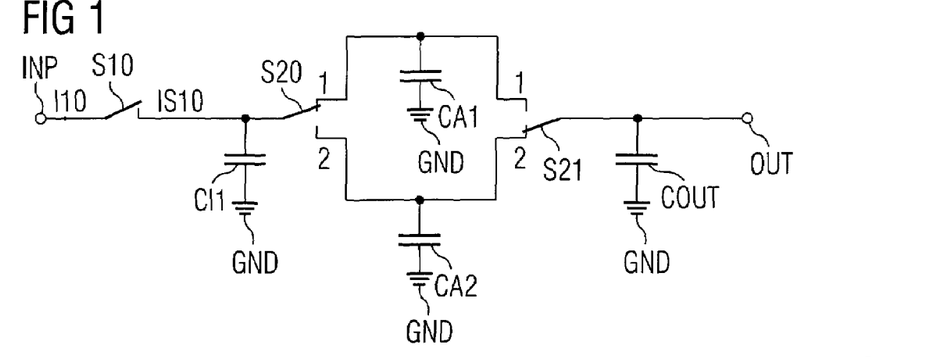
FIG. 1 is a schematic diagram illustrating an embodiment of a filter arrangement.

FIG. 1 shows an embodiment of a filter arrangement which comprises a set of storage elements CI1, CA1, CA2, COUT. The filter arrangement comprises a signal input INP to receive an input signal I10 which may be an input current. The input storage element CI1 comprises a first terminal which is coupled to the signal input INP via a switching element S10. A second terminal of the input storage element CI1 is coupled to a reference voltage connection GND. A first and a second auxiliary storage element CA1, CA2 in each case comprise a first terminal which can be coupled to the first terminal of the input storage element CI1 or to a first terminal of an output storage element COUT via respective switching elements S20, S21. Second terminals of the first and the second auxiliary storage element CA1, CA2 and the output storage element COUT are coupled to the same reference voltage connection GND as the input storage element CI1. The first terminal of the output storage element COUT is further coupled to a filter output OUT.

The switching elements S20, S21 can be controlled by a switching signal. In other words, the first and the second auxiliary storage element CA1, CA2 can each be connected in parallel to the input storage element CI1 or to the output storage element COUT depending on the switching signal. The switching element S10 can be controlled by a reference clock signal.

During normal operation, the switching elements S20, S21 are controlled such that either the first auxiliary storage element CA1 or the second auxiliary storage element CA2 is connected to the input storage element CI1. Accordingly, either the first auxiliary storage element CA1 or the second auxiliary storage element CA2 is coupled to the output storage element COUT. So in each case, the input storage element CI1 is connected in parallel to one of the auxiliary storage elements CA1, CA2 while the output storage element COUT is connected in parallel to the other one of the auxiliary storage elements CA1, CA2.

In one embodiment, all of the storage elements CI1, CA1, CA2, COUT comprise a capacitor. For example, the storage elements CI1, CA1, CA2, COUT comprise metal-insulator-metal (MIM) capacitors which are realized in an integrated circuit. It is also possible to use ground reference capacitors for the storage elements CI1, CA1, CA2, COUT, wherein the capacitors are formed close to a substrate during the manufacturing process of the integrated circuit. During normal operation, the substrate is electrically coupled to the reference voltage connection GND, thus reducing the impact of parasitic capacitances on the close to substrate capacitor types. In one embodiment, the capacitances of the first and the second auxiliary storage element CA1, CA2 have the same nominal value. Furthermore, in one embodiment the capacitances of the input storage element CI1 and the output storage element COUT can also have the same nominal value. During normal operation, the nominal value of the capacitance of the input storage element CI1 and the output storage element COUT, respectively, differ from the capacitance of the auxiliary storage elements CA1, CA2.

When operating the filter arrangement shown in FIG. 1, an input signal or input current I10 is provided at the signal input INP. The input signal is sampled using the switching element S10 depending on a reference clock signal, thus generating the sampled input signal IS10 comprising for example a baseband frequency or an intermediate frequency. A respective input charge is provided to the input storage element CI1 and the respective parallel connected auxiliary storage element CA1, CA2 by the sampled input signal IS10 during the times at which the switching element S10 is closed.

In a first time segment, for example, the input storage element CI1 and the first auxiliary storage element CA1 are connected in parallel by the switching element S20 while the output storage element COUT and the second auxiliary storage element CA2 are connected in parallel by the switching element S21. A charge Q1 resulting in the input storage element CI1 is $$Q_1 = \frac{C_{I1}}{C_{I1} + C_{A12}} \cdot (Q_{IN} + Q_{1R} + Q_{A1R}), \quad (1)$$

with $Q_{IN}$ being the charge provided by the sampled input signal IS10, $C_{I1}$ being the capacitance of the input storage element CI1 and $C_{A12}$ being the capacitance of the auxiliary storage elements CA1, CA2. The charges $Q_{IR}$, $Q_{A1R}$ denote residual charges or respective previously stored charges of the input storage element CI1 and the first auxiliary storage element CA1, respectively. Accordingly, a charge $Q_{A1}$ at the first auxiliary storage element CA1 results to $$A_{A1} = \frac{C_{A12}}{C_{I1} + C_{A12}} \cdot (Q_{IN} + Q_{1R} + Q_{A1R}). \quad (2)$$

In the same manner, charges stored in the output storage element COUT and the second auxiliary storage element CA1 are distributed or balanced out between these storage elements COUT, CA2 according to their capacitance values, such that a charge $Q_O$ of the output storage element COUT results to $$Q_O = \frac{C_O}{C_O + C_{A12}} \cdot (Q_{OR} + Q_{A2R}) \quad (3)$$

in which $C_O$ is the capacitance of the output storage element COUT and charges $Q_{OR}$, $Q_{A2R}$ denote charges previously stored in the output storage element COUT and the second auxiliary storage element CA2. Accordingly, a charge $Q_{A2}$ of the second auxiliary storage element CA2 results to $$Q_{A2} = \frac{C_{A12}}{C_O + C_{A12}} \cdot (Q_{OR} + Q_{A2R}) \quad (4)$$

For example, after one sampling period T of the reference clock signal, the switching elements S20 and S21 change their state such that the switching element S20 connects the input storage element CI1 in parallel to the second auxiliary storage element CA2 and the switching element S21 connects the output storage element COUT in parallel to the first auxiliary storage element CA1. In other words, during a second time segment, a charge distribution of the input charge $Q_{IN}$ and respective previously stored charges $Q_{1R}$, $Q_{A1R}$, $Q_{A2R}$, $Q_{OR}$ is performed according to equations (1), (2), (3) and (4) wherein charges $Q_{A1}$, $Q_{A1R}$ are to be exchanged with charges $Q_{A2}$, $Q_{A2R}$, respectively.

In a further time segment following the second time segment, the switching elements S20, S21 can be connected as in the first time segment. In other words, the first and the second time segment can temporarily alternately succeed one another.

Since there is no resetting or discharging of the storage elements CI1, CA1, CA2, COUT, each of the storage elements has a history charge from a former state. Due to this history charge, during every clock cycle of the reference clock signal a certain amount of charge is transferred from the input storage element CI1 to the output storage element COUT over the auxiliary storage elements CA1, CA2 and vice-versa. As can be seen from equations (1), (2), (3) and (4), the amount of charge depends on the respective capacitance ratios.

If, for example, the capacitance values of the input storage elements CI1 and the output storage elements COUT are larger compared to the capacitance values of the auxiliary storage elements CA1, CA2, most of the charge remains in the large input storage elements CI1 and only a small part is delivered from the input storage element CI1 to the output storage element COUT after two clock cycles of the reference clock signal. As a consequence, an infinite impulse response (IIR) filtering is achieved which can have a low pass filter characteristic depending on the respective capacitance values. In other words, the storage elements CI1, CA1, CA2, COUT and the switching elements S20, S21 form an IIR filter which can be used as a loop filter.

Figure 2:
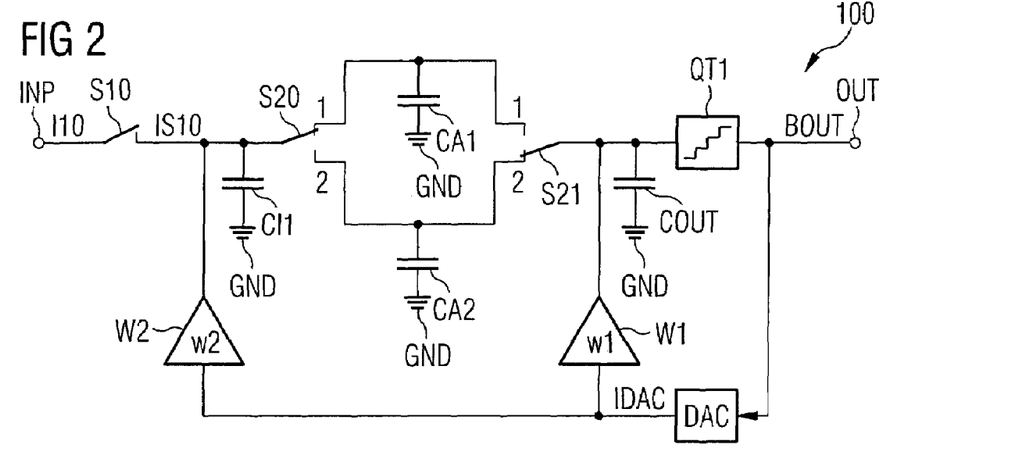
FIG. 2 is a schematic diagram illustrating a first embodiment of an analog-to-digital converter.

FIG. 2 shows an embodiment of an analog-to-digital converter 100 which comprises a filter arrangement according to the embodiment of FIG. 1 as a loop filter. Furthermore, a quantizer QT1 is coupled to the output of the filter arrangement, that means to the first terminal of the output storage element COUT. The analog-to-digital converter 100 further comprises a feedback path comprising a digital-to-analog converter DAC with an input coupled to an output of the quantizer QT1, a first weighting element W1 coupling the digital-to-analog converter DAC to the output storage element COUT, and a second weighting element W2 coupling the digital-to-analog converter DAC to the input storage element CI1.

The quantizer QT1 provides an output word BOUT at its output depending on a signal at its input. To this end, a signal, for example a voltage signal, is derived from the charge stored in the output storage element COUT and in the respective parallel connected auxiliary storage element CA1 or CA2. The digital quantized output word BOUT corresponding to this signal is provided to the digital-to-analog converter DAC for generating a respective analog signal, which in this embodiment may be an analog current IDAC. The quantizer QT1 and the digital-to-analog converter DAC can be operated in a clocked fashion, for example depending on a clock signal being identical to or being derived from the reference clock signal, or in an unclocked, continuous fashion. In other words, the quantizer QT1 can provide the output word BOUT as a discrete time and discrete value signal or just as a discrete value signal in an unclocked case. Accordingly, the output signal IDAC of the digital-to-analog converter DAC can change only at certain clock times for a clocked operation or whenever the output word BOUT changes for an unclocked operation in various embodiments.

In one embodiment, the current signal IDAC is provided in a clocked fashion, that means in a non-continuous way. For example, the current IDAC is only provided at the times at which the switching element S10 is in a closed state, that means at which the input signal IS10 is provided.

The output current IDAC of the digital-to-analog converter is weighted by a first weighting factor w1 and provided to the output storage element COUT. Accordingly, the current IDAC is also weighted by a second weighting factor w2 and provided to input storage element CI1. Thus, a first feedback signal is provided to the output storage element COUT and a second feedback signal is provided to the input storage element CI1.

Through the IIR loop filter, which is operated in a clocked fashion depending on a switching signal, the clocked switching element S10, the quantizer QT1 and the feedback path comprising the digital-to-analog converter DAC, a ΣΔ analog-to-digital converter can be realized. To this end, the transfer function of the ΣΔ modulation stages is realized by the loop filter and depends on its respective capacitances of the storage elements CI1, CA1, CA2, COUT.

The quantizer QT1 and the digital-to-analog converter DAC can be configured for multibit operations such that the output word BOUT comprises a word length greater than 1. In this case, the quantizer QT1 quantizes the signal at the output storage element COUT for a number of quantization levels which usually is a power of 2. Accordingly, the digital-to-analog converter DAC can generate its output current IDAC with the same number of possible different output current values.

In another embodiment, the quantizer QT1 comprises a comparator which compares the signal at the output storage element COUT with a reference value and provides a single output bit as the output word BOUT which can have one of two possible binary values. Accordingly, the digital-to-analog converter DAC can be a controllable current source providing its output current depending on the binary value of the output word BOUT. It is also possible that the digital-to-analog converter comprises, for example, a current mirror with several outputs to directly provide the weighted feedback signals to the input storage element CI1 and the output storage element COUT.

Figure 3:
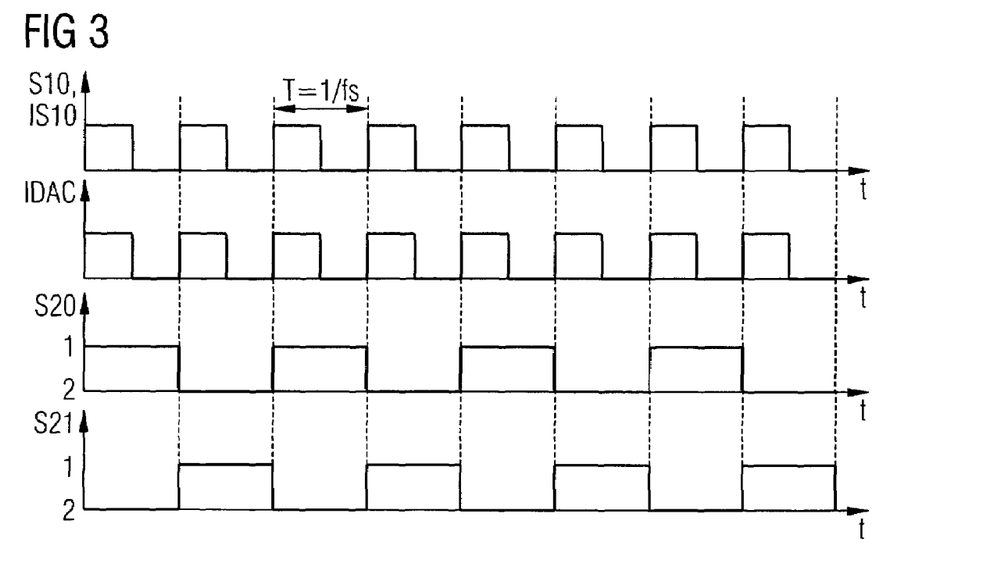
FIG. 3 is a timing diagram illustrating signals used in the embodiments of FIGS. 1 and 2.

FIG. 3 shows an example of a timing diagram of signals which can be used in the embodiment of the analog-to-digital converter shown in FIG. 2. The signals S10, IS10 show a reference clock signal and a respective clocked input signal IS10, wherein a clock period T results from the clock frequency fs of the reference clock signal. The signal S10 controls the respective switching element such that an input current I10, which for this diagram is assumed to be a constant signal, is sampled, resulting in the clocked current IS10 used for charging the input storage element CI1 and the respective auxiliary storage element CA1 or CA2. Accordingly, the output current IDAC of the digital-to-analog converter DAC is generated at the same time as the sampled input signal IS10. Therefore, the input current IS10 and the respective feedback signals derived from the current IDAC are provided to the respective storage elements synchronously.

During a first time segment, a respective switching signal for the switching element S20 is in a first state, connecting the input storage element CI1 and the first auxiliary storage element CA1 in parallel, whereas a respective switching signal for the switching element S21 is in a second state, connecting the output storage element COUT and the second auxiliary storage element CA2 in parallel. Accordingly, during a second time segment, the states of the switching signals S20, S21 are changed such that the input storage element CI1 and the output storage element COUT are connected in parallel to the respective other auxiliary storage element CA1, CA2. First and second time segments temporarily alternately succeed one another in one embodiment.

Therefore, during the first time segment, charges stored in the input storage element CI and the first auxiliary storage element CA1 are modified together depending on their respective previously stored charges, on a charge provided by the sampled input signal IS10 and on a charge provided by the second feedback signal from the digital-to-analog converter DAC. At the same time, charges stored in the output storage element COUT and the second auxiliary storage element CA2 are modified together depending on their respective previously stored charged and on a charge provided by the first feedback signal from the digital-to-analog converter DAC.

During the second time segment, the charges stored in the input storage element and the second auxiliary storage element are modified together depending on their respective previously stored charges, on the charge provided by the sample input signal IS10 and the charge provided by the second feedback signal, whereas the charges stored in the output storage element COUT and the first auxiliary storage element CA1 are modified together depending on their respective previously stored charges and on the charge provided by the first feedback signal.

Figure 4:
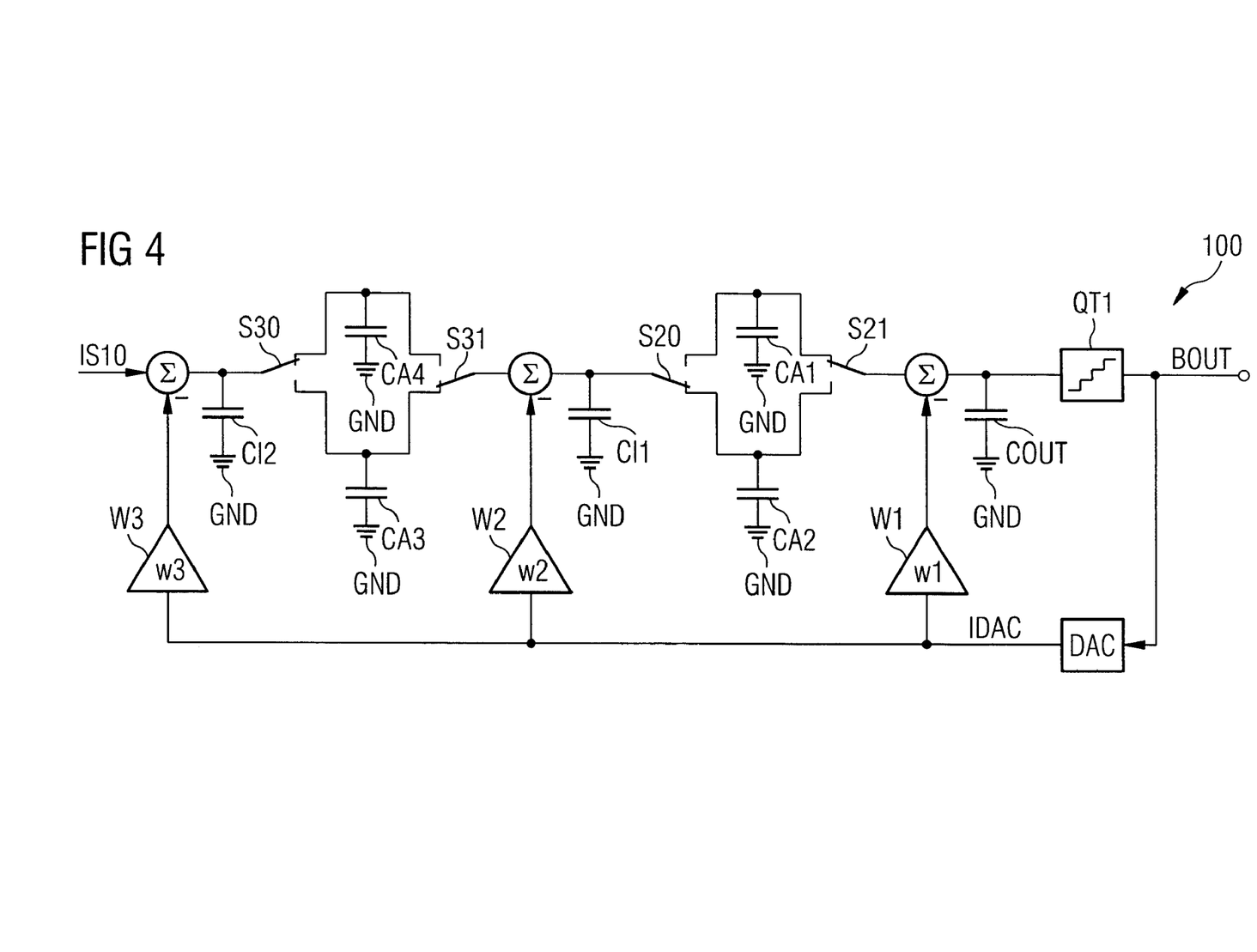
FIG. 4 is a schematic diagram illustrating a second embodiment of an analog-to-digital converter.

FIG. 4 shows another embodiment of an analog-to-digital converter 100 comprising a first and a second filter stage. The first filter stage is formed by the first input storage element CI1, the auxiliary storage elements CA1, CA2 and the switching elements S20, S21. A second filter stage comprises a further, second input storage element CI2, a third and a fourth auxiliary storage element CA3, CA4 and further switching elements S30, S31. The third and the fourth auxiliary storage element CA3, CA4 can each be connected in parallel to the second input storage element CI2 or to the first input storage element CI1 depending on a switching signal controlling the switching elements S30, S31. Therefore, the structures of the first and the second filter stage correspond to each other.

The feedback path comprises a third weighting element W3 which couples the digital-to-analog converter DAC to a second filter input formed by a first terminal of the second input storage element CI2. In one embodiment the summation elements to which the feedback signals are provided can be simple current junctions to which feedback currents can be provided. A negative sign of the respective feedback signals can be realized by directly providing negative currents, for example by a negative output current IDAC of the digital-to-analog converter DAC.

The second filter stage couples the first filter input formed by the first terminal of the first input storage element CI1 to the output of the sampling unit S10, which is not shown in this figure. The sampling unit S10 provides the sampled input current IS10.

During operation of the analog-to-digital converter 100 of FIG. 4, the storage elements CI1, CA1, CA2, COUT are connected, respectively, through the switching elements S20, S21 as described before during respective first and second time segments. Furthermore, during the first time segment, the further input storage element CI2 and the third auxiliary storage element CA3 are connected in parallel by the switching element S30. Their respective charges are modified together depending on their previously stored charges, on the charge provided by the sampled input signal IS10 and on the charge provided by the third feedback signal via the third weighting element W3. The fourth auxiliary storage element CA4 is connected in parallel to the first input storage element CI1 and the first auxiliary storage element CA1 during this first time segment. Their charges are modified together depending on their previously stored charges and on the charge provided by the second feedback signal via the second weighting element W2.

Accordingly, during the second time segment, the second input storage element CI2 and the fourth auxiliary storage element CA4 as well as the first input storage element CI1 and the second and the third auxiliary storage elements CA2, CA3 are connected in parallel, respectively. Thus, their respective charges are modified according to the previously described examples.

With reference to FIGS. 1 and 2, the loop filter formed by the first filter stage and the output storage element COUT works as an integrator in series with a resonator. The integration is based on the fact that the input storage element CI1 keeps most of its charge as usually having a larger capacitance than the auxiliary storage elements. The resonator function results from transferring charge from the input storage element CI1 to the output storage element COUT via the auxiliary storage elements CA1, CA2. The loop filter transfer function $H_{LF}(z)$, that means without feedback paths, is given by $$H_{LF}(z) = \frac{Q_O}{Q_{IN}} = \frac{V_{CO} \cdot C_O}{I_{I10} \cdot T \cdot 0,5} = \frac{a \cdot b \cdot z}{z^2 + (a-b-1) \cdot z + b - a}, \quad (5)$$

wherein $$a = \frac{C_{A12}}{C_{I1} + C_{A12}}; \quad b = \frac{C_O}{C_{A12} + C_O}; \quad T = \frac{1}{fs}. \quad (6)$$

$V_{CO}$ is the voltage over the output storage element COUT which can be quantized by the quantizer QT1 of FIG. 2. $I_{I10}$ is the current value of the input current I10 provided at the signal input which is sampled by the sampling unit S10.

Figure 5:
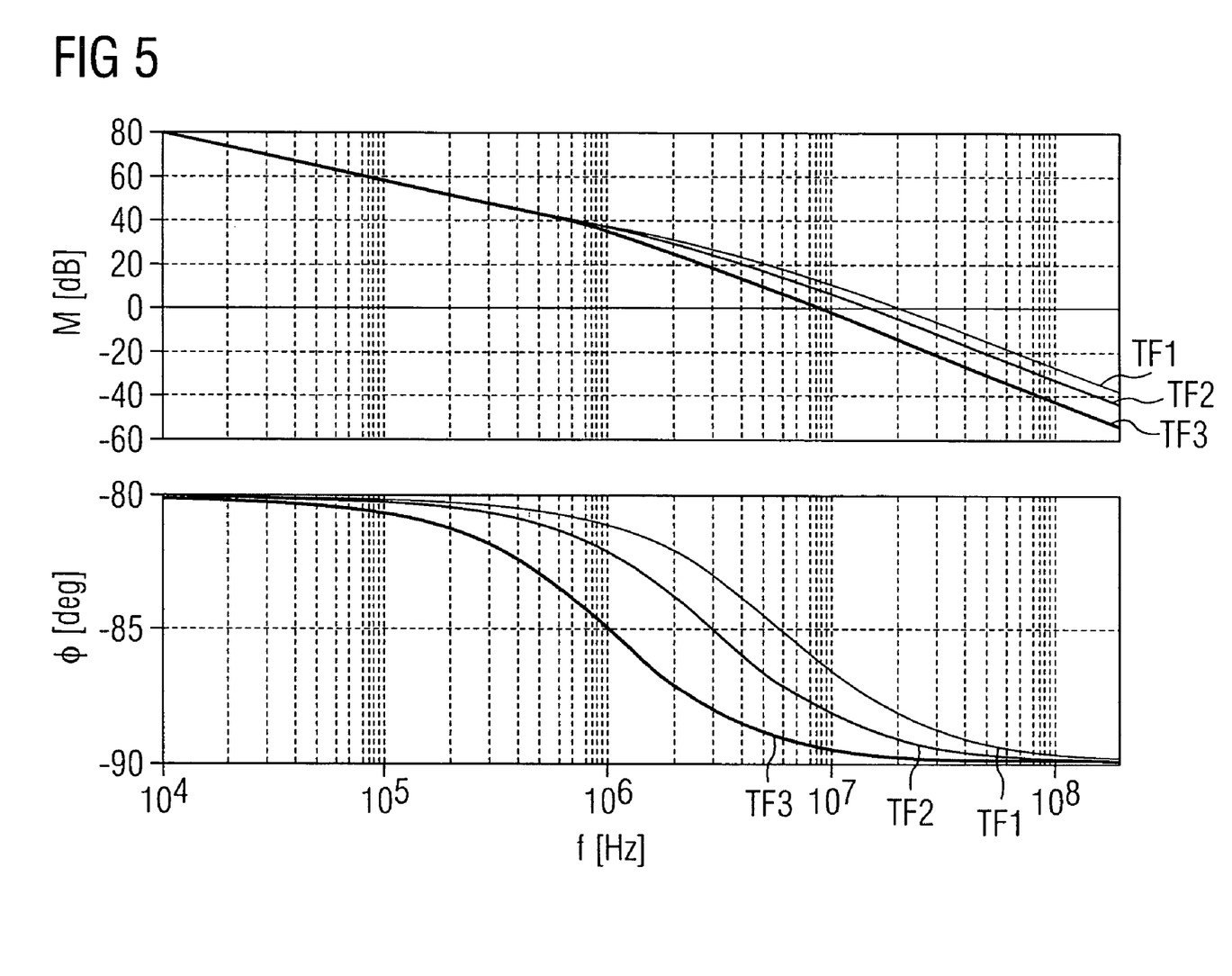
FIG. 5 is a signal diagram illustrating a transfer function of a loop filter.

FIG. 5 shows a frequency diagram with loop filter functions TF1, TF2, TF3 for different capacitance ratios of the storage elements CI1, CA1, CA2, COUT, wherein in each case input and output capacitances $C_{I1}$, $C_O$ are equal. Also the auxiliary capacitances $C_{A12}$ are of the same nominal value. For the first transfer function TF1, the relation $C_{I1}/C_{A12}$ is assumed to be $C_{I1}/C_{A12}=50$, for a second transfer function TF2 it is assumed to be $C_{I1}/C_{A12}=100$, and for the third transfer function TF3 it is assumed to be $C_{I1}/C_{A12}=150$.

It can be seen from magnitude M and phase $\Phi$ respectively in FIG. 5 that the transfer functions TF1, TF2, TF3 show a low pass characteristic wherein their respective cut-off frequencies vary with the above-mentioned different capacitance ratios.

Figure 6:
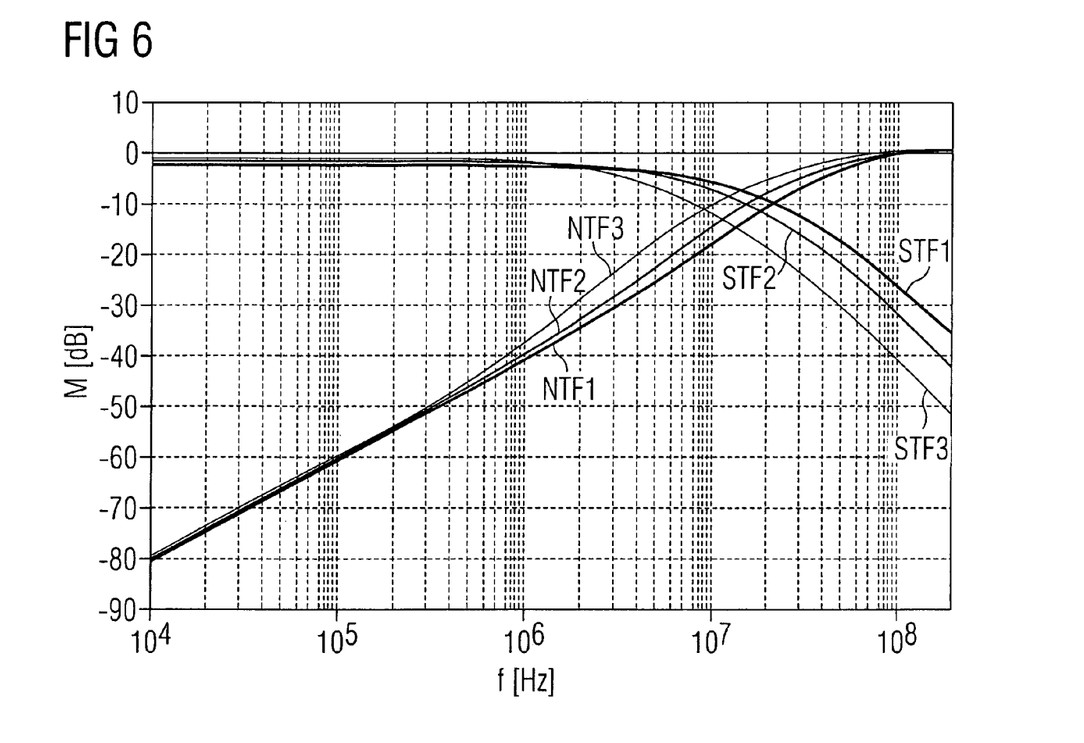
FIG. 6 is a signal diagram illustrating signal transfer functions and noise transfer functions.

FIG. 6 shows an exemplary frequency diagram of signal transfer functions (STF) and noise transfer function (NTF) of the loop filter, embedded in the closed $\Sigma\Delta$ loop shown, for example, in FIG. 2. For deriving the respective transfer functions, the quantizer QT1 and the digital-to-analog converter DAC are linearized, which is a method well-known in the art. To this end, a statistical noise model is introduced for quantization noise, for example. Therefore, the signal transfer function of the closed loop results to $$STF(z) = \qquad (7)$$
$$\frac{Q_O}{Q_{IN}} = \frac{a \cdot b \cdot z}{z^2 + (b \cdot w1 - b + a - 1) \cdot z + (a-1) \cdot b \cdot w1 + a \cdot b \cdot w2 + b - a}$$

Accordingly, the noise transfer function of the closed loop results to $$NTF(z) = \qquad (8)$$
$$\frac{Q_O}{Q_R} = \frac{z^2 + (a-b-1) \cdot z + b - a}{z^2 + (b \cdot w1 - b + a - 1) \cdot z + (a-1) \cdot b \cdot w1 + a \cdot b \cdot w2 + b - a}$$

wherein $Q_R$ denotes a charge corresponding to the quantization noise.

The signal transfer functions STF1, STF2, STF3 shown in the diagram correspond to the same capacitance ratios (50, 100, 150) as the respective transfer functions of FIG. 5, wherein for the first signal transfer function STF1, the first weighting factor w1 is chosen to w1=0.4, for the second signal transfer function STF2, the weighting factor w1 is chosen to w1=0.3, and for the third signal transfer function STF3, the weighting factor w1 is chosen to w1=0.2.

The respective noise transfer function NTF1, NTF2, NTF3 are shown for the same sets of capacitances and weighting factors, respectively. It can be seen from the noise transfer functions NTF1, NTF2, NTF3 that noise, for example quantization noise, is attenuated for lower frequencies. Accordingly, the signal transfer functions STF1, STF2, STF3 show an attenuation of higher frequency components such that out of band interferer are attenuated. It can further be seen that by changing the first weighting factor w1, an overshoot of the signal transfer functions can be adjusted while changing the respective capacitance ratios results in a variation of the cut-off frequency. If a second filter stage is implemented, as, for example, in the embodiment shown in FIG. 4, the out-of-band attenuation of the signal transfer function can be increased. This results, for example, from the additional resonators in the loop, that means additional possibilities of charge transfer from input to output.

Figure 7:
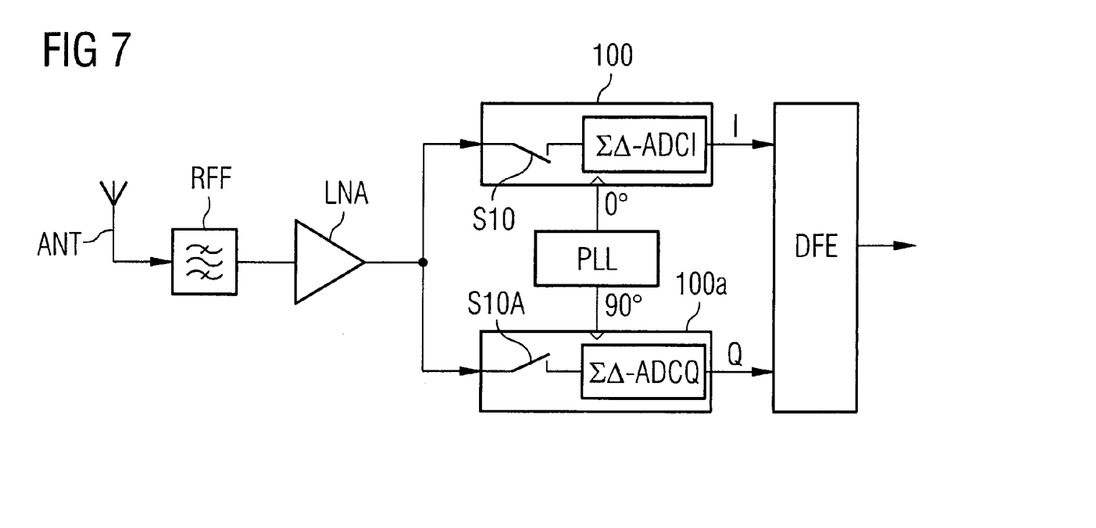
FIG. 7 is a block diagram illustrating a first embodiment of a receiver arrangement.

FIG. 7 shows an exemplary embodiment of a receiver arrangement comprising a radio frequency filter RFF receiving a signal from an antenna ANT. The arrangement further comprises a low-noise antenna amplifier LNA coupled to an output of the radio frequency filter RFF, and a first and a second analog-to-digital converter 100, 100a which on their input side are coupled to an output of the antenna amplifier LNA. Respective outputs of the analog-to-digital converters 100, 100a are coupled to a digital processing unit DFE. The receiver arrangement further comprises a frequency generation circuit PLL providing reference clock signals for the analog-to-digital converters 100, 100a. For example, each of the analog-to-digital converters 100, 100a can be realized with an embodiment as shown in FIG. 2 or FIG. 4. In other words, the first and the second analog-to-digital converter 100, 100a have the same structure.

For example, the receiver arrangement shown in FIG. 7 is configured to perform an analog-to-digital conversion of complex components I, Q of respective complex symbols which are encoded in the radio frequency signal received via the antenna ANT. The complex components I, Q are provided to the digital processing unit DFE as the respective digital values. In another embodiment an input interface which for example is a wired interface can be used instead of the antenna for receiving the radio frequency signal.

To this end, each of the analog-to-digital converters 100, 100a comprises a respective sampling unit S10, S10a, which is clocked by respective reference clock signal which comprise a phase shift of 90° to each other. The phase shift results in a respective time shift of the switching signals controlling the switching elements S10, S10a. Accordingly, the switching signals for the ΣΔ loop filter and quantization structures ΣΔ-ADCI, ΣΔ-ADCQ are time-shifted, too.

The digital processing unit evaluates the complex digital signals I, Q for restoring the respective complex symbols and deriving a digital data stream, for example. As the analog-to-digital converters usually are operated with a high sampling frequency resulting in a large oversampling ratio, the respective digital output signals I, Q can be decimated, for example in the digital processing unit DFE, before a further processing. For example, the decimation can be performed using cascaded integrated comb filters (CIC).

Figure 8:
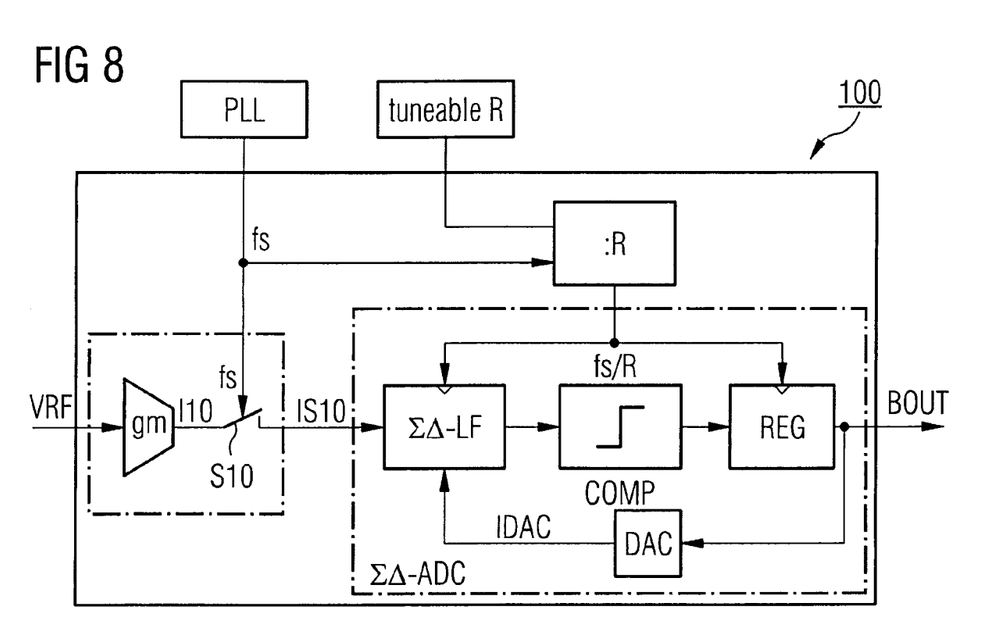
FIG. 8 is a block diagram illustrating a third embodiment of an analog-to-digital converter.

FIG. 8 shows an embodiment of an analog-to-digital converter 100 which can be used within the receiver arrangement shown in FIG. 7. It comprises a voltage-to-current converter which is realized as a transconductance amplifier gm receiving a radio frequency voltage VRF and providing the current I10 to the sampling unit S10. The sampling unit S10 is controlled by the reference clock signal provided by the frequency generation circuit PLL which can comprise a phase locked loop. The output of the sampling unit S10 is coupled to the ΣΔ loop filter ΣΔ-LF which comprises a clock input and a feedback input for receiving the output current IDAC of the digital-to-analog converter DAC. The output of the loop filter ΣΔ-LF is coupled to a comparator device COMP which on its output side is coupled to a clocked output register REG for providing the digital output word BOUT. The arrangement further comprises a frequency divider which is coupled to the frequency generation circuit PLL for receiving the reference clock signal and to a control circuit for controlling the tunable division factor R. The output of the frequency divider is coupled to the loop filter ΣΔ-LF and to the output register REG.

As the function of the loop filter ΣΔ-LF is based on the transportation of charges, it is desirable that the signal received as a voltage signal from the antenna is converted to the current signal I10 via the transconductance amplifier gm. The sampled input signal IS10 is generated depending on the reference clock signal having the clock frequency fs. The switching elements S20, S21, which are not shown here but may be implemented according to FIG. 1 or 2, for example, are controlled by the switching signal derived from the reference clock signal by a frequency division with the division factor R. Therefore, a respective duration of the first and the second time segment depends on the reference clock signal.

The output of the loop filter ΣΔ-LF is compared to a reference value or threshold value by the comparator device COMP for generating a one bit binary signal which is provided to the register REG. The register REG which is also clocked with the frequency divided reference clock signal FS/R is configured to store and synchronize the output of the comparator COMP for providing the output word BOUT which is a one bit word in this case. For example, the output register REG comprises a flip flop. In other words, the output word BOUT is provided in a clocked fashion in this embodiment.

In one embodiment, the reference clock signal comprises a frequency fs corresponding to the radio frequency of the signal received via the antenna. In this case, sampling of the input current I10 results in a down-conversion into a baseband signal which in this case is the sampled current IS10. The reference clock signal can be directly used for clocking the ΣΔ loop filter ΣΔ-LF (R=1) or is, depending on the radio frequency, first divided by a division factor R>1 with the frequency divider. As the frequency of the clock signal of the loop filter ΣΔ-LF is lower than the frequency of the reference clock signal used for the sampling unit S10, decimation effects result. In other words, the sample rate reduction provides an inherent moving average decimation filter between these two blocks.

By choosing a frequency fs for the reference clock signal corresponding to or derived from the radio frequency and an intermediate frequency, it is also possible to perform a down-sampling or down-conversion of the input current I10 into a signal comprising the intermediate frequency which can be processed by the analog-to-digital converter.

No channel select filters have to be implemented before the analog-to-digital converter compared to conventional receiver structures. Furthermore, it is possible to provide only one frequency generation circuit PLL for all blocks in the receiver arrangement, including a possible CIC filter in or before the digital processing unit DFE. It is possible to achieve high oversampling ratios, which has a positive effect regarding unwanted noise, for example quantization noise. The structure is independent of a specific mobile communication standard such that it can easily be adapted to different standards by, for example, changing clock frequencies. Therefore, the arrangement can be used in systems implementing software defined radio.

Figure 9:
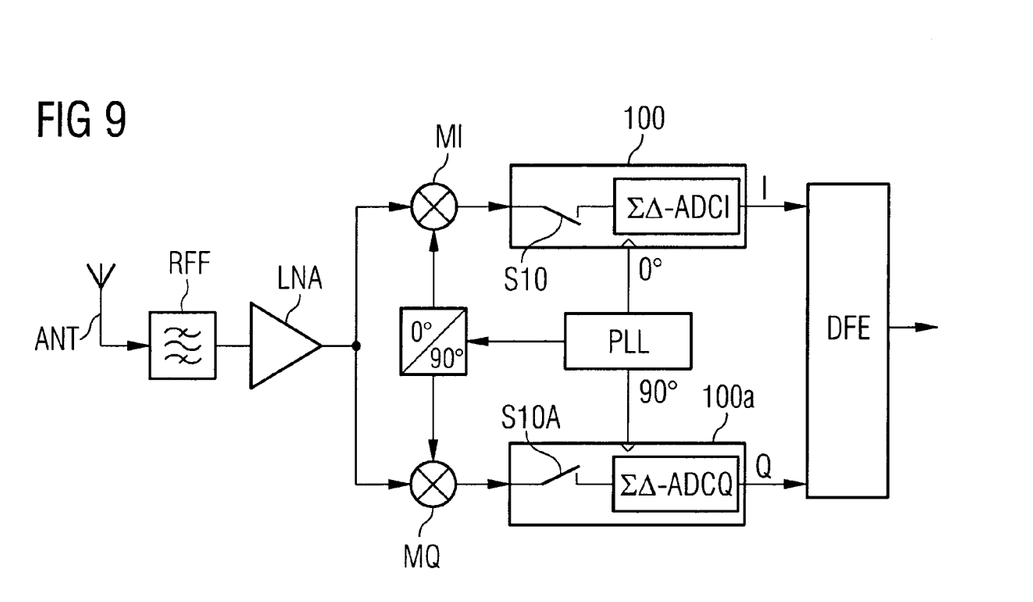
FIG. 9 is a block diagram illustrating a second embodiment of a receiver arrangement.

FIG. 9 shows another embodiment of a receiver arrangement similar to the embodiment shown in FIG. 7. As additional components, two frequency mixers MI, MQ are arranged between the antenna amplifier LNA and the analog-to-digital converters 100, 100a. The mixing devices MI, MQ are configured to receive respective reference clock signals which are phase-shifted with respect to each other, which is accomplished by a phase shifter coupled to the frequency generation circuit PLL. In this arrangement, the down-mixing of the radio frequency signal received from the antenna ANT is performed using the mixing devices MI, MQ. The analog-to-digital converters 100, 100a in this case perform an analog-to-digital conversion of the respective complex baseband components. In one embodiment an input interface which for example is a wired interface can be used instead of the antenna for receiving the radio frequency signal.

In another embodiment the reference clock signals provided to the mixing devices MI, MQ are generated by a separate, independent clock generator not shown here. In this case the frequencies of the clock and switching signals in the mixing devices MI, MQ and the analog-to-digital converters are independent from each other or, in other words, can be unsynchronized to each other.

Figure 10:
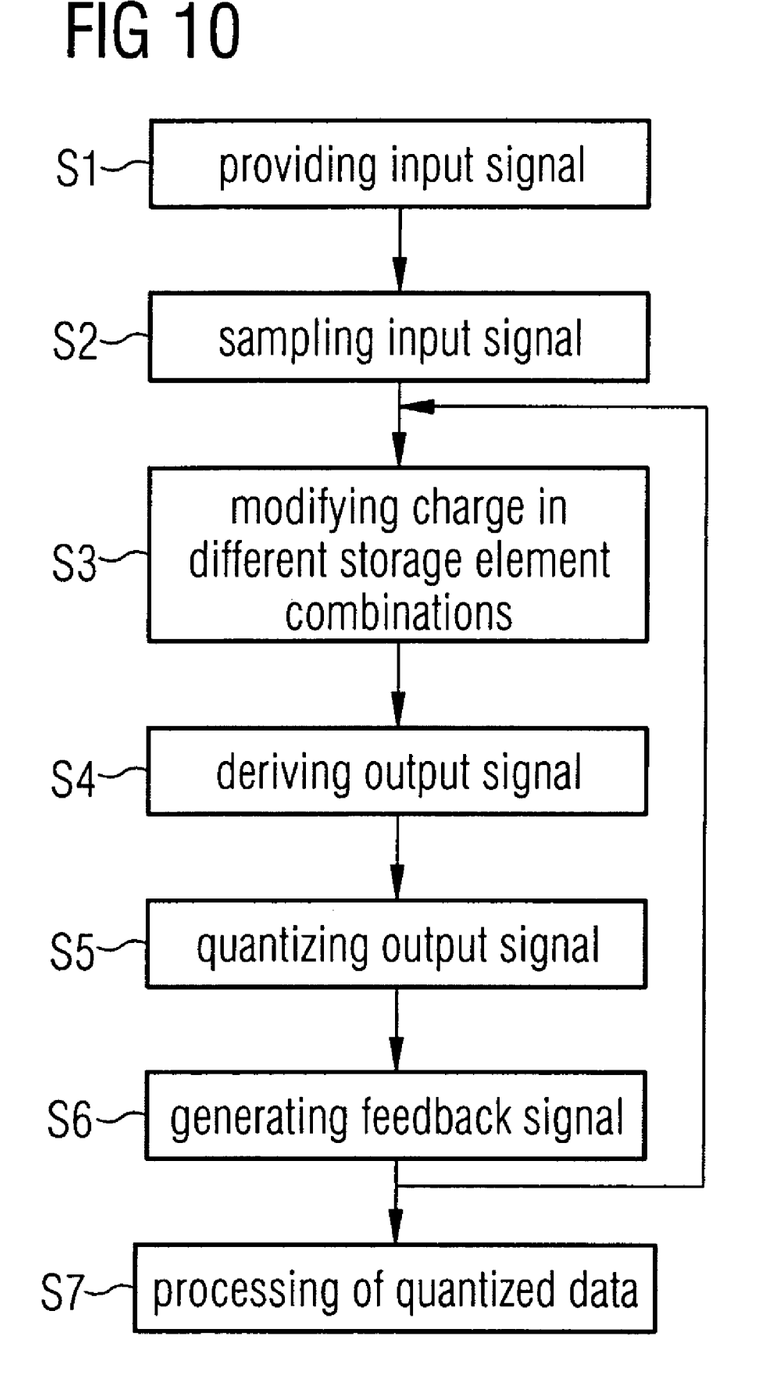
FIG. 10 is a flow chart diagram illustrating an embodiment of a signal processing method.

FIG. 10 shows an embodiment of a signal processing method. While the method and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated actions may be required to implement a methodology in accordance with the invention.

At S1, an input signal is provided. This can comprise amplifying a signal received by an antenna. Furthermore, the input signal can be provided by deriving a current signal from a voltage signal. The input signal can also be filtered.

At S2, the input signal is sampled depending on a reference clock signal. For example, in one embodiment, sampling comprises a down-mixing of the input signal being in a radio frequency domain to a baseband signal or to a signal comprising an intermediate frequency.

At S3, a charge provided by the sampled input signal is used to modify the charge stored in an input storage element CI1 and a respective parallel connected auxiliary storage element CA1 or CA2. For example, during a first time segment, charges stored in the input storage element CI1 and the first auxiliary storage element CA1 are modified depending on their respective previously stored charges and on the charge provided by the sampled input signal. Also during the first segment, charges stored in an output storage element COUT and a second auxiliary storage element CA2 are modified depending on their respective previously stored charges.

During a second time segment, charges stored in the input storage element CI1 and the second auxiliary storage element CA2 are modified depending on their respective previously stored charges and on the charge provided by the sampled input signal, while charges stored in the output storage element COUT and the first auxiliary storage element CA1 are modified depending on their respective previously stored charges. First and second time segments can temporarily alternately succeed one another in one embodiment. A respective duration of the first and the second time segment can depend on the reference clock signal.

For example, in the first time segment, the input storage element CI1 and the first auxiliary storage element CA1 as well as the output storage element COUT and the second auxiliary storage element CA2 are connected in parallel, respectively. Accordingly, during the second time segment, the input storage element CI1 and the second auxiliary storage element CA2 as well as the output storage element COUT and the first auxiliary storage element CA1 are connected in parallel, respectively.

In one embodiment, the charge stored in the output storage element is further modified depending on a charge provided by a first feedback signal. Accordingly, the charge stored in the input storage element CI1 is modified further depending on a charge provided by a second feedback signal.

In a further embodiment, during the first time segment, charges stored in further input storage element CI2 and a third auxiliary storage element CA3 are modified depending on their respective previously stored charges and on the charge provided by the sampled input signal, while charges stored in the input storage element CI1, the first auxiliary storage element CA1 and a fourth auxiliary storage element CA4 are modified depending on their respective previously stored charges. During the second time segment, charges stored in the further input storage element CI2 and a fourth auxiliary storage element CA4 are modified depending on their respective previously stored charges and on the charge provided by the sampled input signal, while charges stored in the input storage element CI1, the second auxiliary storage element CA2 and the third auxiliary storage element CA3 are modified depending on their respective previously stored charges.

In a further embodiment, the charge stored in the further input storage element CI2 is modified further depending on a charge provided by a third feedback signal.

At S4, an output signal is derived from the charges stored in the storage elements. For example, a voltage over the output storage element is derived depending on the charge stored in the output storage element COUT and the capacitance CO of the output storage element COUT. As one of the auxiliary storage elements is connected in parallel to the output storage element COUT, the respective output signal or output voltage further depends on the charge stored in the auxiliary storage element and on its respective capacitance.

At S5, the output signal is quantized, that means a respective digital or discrete representation of the value of the output signal is determined. This can, for example, be done by comparing the output signal to one or more threshold values with respective comparator devices or, for a multibit quantization, with a successive approximation. The result of the quantization process is a digital output word which can have word length of equal to or greater than 1. The output word can be synchronized using the reference clock signal or a clock signal derived from the reference clock signal to achieve a signal being discrete in time and discrete in value.

At S6, one or more feedback signals can be generated from the digital output word. For example, the digital output word is converted to an analog signal using a digital-to-analog conversion and scaling the digital-to-analog converted signal with a scaling factor or weighting factor. Depending on the number of feedback signals needed in the filtering process at S3, the digital-to-analog converted output word can be scaled by different weighting factors to have a respective number of different weighted feedback signals.

At S7, the quantized digital output word of S5 can be further processed. For example, the digital output word corresponds to a complex component of a complex signal or a complex symbol which can be recombined with another complex component derived similarly to get the respective complex symbol originally coded into the input signal. The processing of the quantized data can further comprise a decimation filtering to reduce the higher sampling rate of the analog-to-digital conversion.

In one embodiment, the operations at S5, S6 and S7 can be omitted for a simple filter processing of the input signal.

The arrangements and methods described in the various embodiments can especially be used for applications where a high dynamic range is required. They can also be used for higher frequency bandwidths of the signals to be processed, for example for signals according to the ultra-wide band (UWB) standard or the Worldwide Interoperability for Microwave Access (WiMAX) standard as well as mobile communication standards like GSM/EDGE or UMTS.

The arrangements shown in the embodiments do not depend on frequency dependent active components like operational amplifiers which makes it possible to work at high clocking frequencies, up to at least a few GHz. Therefore, high oversampling ratios can be achieved, which has a positive effect on the quantization noise. Due to the fact that the loop filters shown in the various embodiments can be regarded as passive filters, no constraints in the filter design regarding bandwidth limitation of active devices occur. Furthermore, a decreasing transconductance (gm) due to shrinking of future technology can easily be considered in respective implementations.

The signal transfer function has the form of a low pass filter which means that unwanted signals with frequencies higher than the filter cut-off frequency are attenuated. This relaxes the dynamic range requirements. The cut-off frequency can also be adjusted by adapting the respective capacitance ratios in the loop filter and can therefore be adjusted to different bandwidths. As the clocking frequency of the analog-to-digital converter can be generated by a frequency generation circuit like a phase locked loop, the analog-to-digital converter is not required to have its own clock generator, resulting in saved area and reduced costs.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. An analog-to-digital converter, comprising:
   a signal input;
   a sampling unit coupled to the signal input;
   a quantizer configured to provide an output word at its output depending on a signal at its input;
   an output storage element coupled to the input of the quantizer;
   a first filter stage comprising a first filter input coupled to an output of the sampling unit, an input storage element coupled to the first filter input, and a first and a second auxiliary storage element that are each selectively connected in parallel to the input storage element or to the output storage element in alternate fashion depending on a switching signal; and
   a feedback path comprising a digital-to-analog converter with an input configured to receive the output word, a first weighting element coupled between an output of the digital-to-analog converter and the output storage element, and a second weighting element coupled between an output of the digital-to-analog converter and the first filter input.

2. The analog-to-digital converter of claim 1, further comprising:
   a second filter stage configured to couple the output of the sampling unit to the first filter input, the second filter stage comprising a second filter input coupled to the output of the sampling unit, a further input storage element coupled to the second filter input, and a third and a fourth auxiliary storage element that each are selectively connected in parallel to the further input storage element or to the input storage element of the first filter stage in alternate fashion depending on a further switching signal; and
   a third weighting element comprised by the feedback path, the third weighting element coupled between an output of the digital-to-analog converter and the second filter input.

3. The analog-to-digital converter of claim 1, wherein the sampling unit comprises a switching element which is controllable by a reference clock signal.

4. The analog-to-digital converter of claim 1, wherein the quantizer comprises a comparator device.

5. The analog-to-digital converter of claim 4, wherein the input storage element, the first and the second auxiliary storage element, and the output storage element each comprise a capacitor.

6. The analog-to-digital converter of claim 1, wherein the signal input and the sampling unit are coupled by means of a voltage-to-current converter.

7. The analog-to-digital converter of claim 6, wherein the voltage-to-current converter comprises a transconductance amplifier.

8. The analog-to-digital converter of claim 1, further comprising a clock driven output register coupled to the output of the quantizer.

9. A receiver arrangement, comprising an amplifier with an input, a first analog-to-digital converter coupled to an output of the amplifier, and a digital processing unit coupled to an output of the first analog-to-digital converter to process a data stream, the first analog-to-digital converter comprising:
   a sampling unit comprising a switching element which is controllable by a reference clock signal, the sampling unit coupled to the output of the amplifier;
   a quantizer configured to provide the data stream based on a signal at its input;
   an output storage element coupled to the input of the quantizer;
   a first filter stage comprising a first filter input coupled to an output of the sampling unit, an input storage element coupled to the first filter input, and a first and a second auxiliary storage element that are each selectively connected in parallel to the input storage element or to the output storage element in alternate fashion depending on a switching signal that is derived from the reference clock signal; and a feedback path comprising a digital-to-analog converter with an input configured to receive the data stream, a first weighting element coupled between an output of the digital-to-analog converter and the output storage element, and a second weighting element coupled between an output of the digital-to-analog converter to the first filter input.

10. The receiver arrangement of claim 9, wherein the first analog-to-digital converter further comprises:

a second filter stage configured to couple the output of the sampling unit to the first filter input, the second filter stage comprising a second filter input coupled to the output of the sampling unit, a further input storage element coupled to the second filter input, and a third and a fourth auxiliary storage element that each are selectively connected in parallel to the further input storage element or to the input storage element of the first filter stage in alternate fashion depending on a further switching signal; and a third weighting element comprised by the feedback path, the third weighting element coupled between an output of the digital-to-analog converter and the second filter input.

11. The receiver arrangement of claim 9, wherein the output of the amplifier and the sampling unit are coupled by means of a voltage-to-current converter.

12. The receiver arrangement of claim 9, further comprising a frequency generation circuit configured to generate the reference clock signal.

13. The receiver arrangement of claim 9, further comprising a programmable frequency divider configured to derive the switching signal from the reference clock signal.

14. The receiver arrangement of claim 9, further comprising an output register coupled to the output of the quantizer, the output register driven by a clock signal that is a function of the reference clock signal.

15. The receiver arrangement of claim 9, further comprising a second analog-to-digital converter coupled between the output of the amplifier and the digital processing unit, the second analog-to-digital converter comprising substantially the same structure as the first analog-to-digital converter, wherein the first analog-to-digital converter is configured to provide the data stream as a first component of a complex digital signal and the second analog-to-digital converter is configured to provide a further data stream as a second component of the complex digital signal.

16. The receiver arrangement of claim 15, wherein the first and the second analog-to-digital converter are configured to receive respective reference clock signals that are phase shifted with respect to each other.

17. The receiver arrangement of claim 15, wherein the first and the second analog-to-digital converter are each coupled to the output of the amplifier by means of respective mixing devices, the mixing devices being configured to receive respective reference clock signals which are phase shifted with respect to each other.

18. A filter arrangement, comprising:

a filter input and a filter output;

a switching element coupled to the filter input, wherein the switching element is selectively controlled by a reference clock signal;

an output storage element coupled to the filter output; and a first filter stage comprising a first input coupled to an output of the switching element, an input storage element coupled to the first input, and a first and a second auxiliary storage element that each are selectively connected in parallel to the input storage element or to the output storage element, wherein in one selective state the input storage element is exclusively coupled to the first auxiliary storage element and the output storage element is exclusively coupled to the second auxiliary storage element or alternatively, in another selective state the input storage element is exclusively coupled to the second auxiliary storage element and the output storage element is exclusively coupled to the first auxiliary storage element, depending on a switching signal.

19. The filter arrangement of claim 18, further comprising a second filter stage coupled between the output of the switching element and the first input, the second filter stage comprising a second input coupled to the output of the switching element, a further input storage element coupled to the second input, and a third and a fourth auxiliary storage element that are each selectively connected in parallel to the further input storage element or to the input storage element of the first filter stage in alternate fashion depending on a further switching signal.

20. The filter arrangement of claim 18, wherein the input storage element, the first and the second auxiliary storage element and the output storage element each comprise a capacitor.

21. The filter arrangement of claim 18, wherein the filter input and the switching element are coupled by means of a voltage-to-current converter.

22. A signal processing method, comprising:

providing an input signal;

sampling the input signal based on a reference clock signal;

modifying, during a first time segment, charges stored in an input storage element and in a first auxiliary storage element based on their respective previously stored charges and on a charge provided by the sampled input signal;

modifying, during the first time segment, charges stored in an output storage element and in a second auxiliary storage element based on their respective previously stored charges;

modifying, during a second time segment, the charges stored in the input storage element and in the second auxiliary storage element based on their respective previously stored charges and on the charge provided by the sampled input signal;

modifying, during the second time segment, the charges stored in the output storage element and in the first auxiliary storage element based on their respective previously stored charges; and deriving a charge dependent signal as a function of the charge stored in the output storage element.

23. The signal processing method of claim 22, further comprising:

quantizing the charge dependent signal to generate an output word;

digital-to-analog converting of the output word;

generating a first feedback signal by scaling the digital-to-analog converted output word by a first weighting factor; and generating a second feedback signal by scaling the digital-to-analog converted output word by a second weighting factor;

wherein modifying the charge stored in the output storage element further depends on a charge provided by the first feedback signal and modifying the charge stored in the input storage element further depends on a charge provided by the second feedback signal.

24. The signal processing method of claim 23,
wherein a third feedback signal is generated by scaling the digital-to-analog converted output word by a third weighting factor;
wherein during the first time segment charges stored in a further input storage element and in a third auxiliary storage element are modified based on their respective previously stored charges, on the charge provided by the sampled input signal and on a charge provided by the third feedback signal;
wherein during the first time segment charges stored in the input storage element, in the first auxiliary storage element and in a fourth auxiliary storage element are modified based on their respective previously stored charges;
wherein during the second time segment charges stored in the further input storage element and in the fourth auxiliary storage element are modified based on their respective previously stored charges, on the charge provided by the sampled input signal and on the charge provided by the third feedback signal; and
wherein during the second time segment charges stored in the input storage element, in the second auxiliary storage element and in the third auxiliary storage element are modified based on their respective previously stored charges.

25. The signal processing method of claim 23, wherein quantizing comprises comparing the charge dependent signal with a reference value.

26. The signal processing method of claim 22, wherein providing the input signal comprises amplifying a signal received by an antenna or by an input interface.

27. The signal processing method of claim 22, wherein providing the input signal comprises deriving a current signal from a voltage signal.

28. The signal processing method of claim 23, wherein the output word is provided in a clocked fashion.

29. The signal processing method of claim 22, wherein a respective duration of the first and the second time segment depends on the reference clock signal.

30. The signal processing method of claim 22, wherein the first and the second time segment temporally alternately succeed one another.

31. A signal processing method, comprising:
providing an input signal;
sampling the input signal based on a reference clock signal;
providing a charge to an input storage element, wherein the charge is based on the sampled input signal;
providing a first feedback signal to an output storage element to influence a charge thereat;
providing a second feedback signal to the input storage element to influence a charge thereat;
connecting in parallel the input storage element and a first auxiliary storage element during a first time segment;
connecting in parallel the output storage element and a second auxiliary storage element during the first time segment;
connecting in parallel the input storage element and the second auxiliary storage element during a second time segment;
connecting in parallel the output storage element and the first auxiliary storage element during the second time segment;
generating an output word by quantizing a signal derived as a function of a charge stored in the output storage element;
digital-to-analog converting of the output word;
generating the first feedback signal by scaling the digital-to-analog converted output word by a first weighting factor; and
generating the second feedback signal by scaling the digital-to-analog converted output word by a second weighting factor.

32. The signal processing method of claim 31, further comprising:
generating a third feedback signal by scaling the digital-to-analog converted output word by a third weighting factor;
providing the third feedback signal and a further charge to a further input storage element, wherein the further charge is based on the sampled input signal;
connecting in parallel the further input storage element and a third auxiliary storage element during the first time segment;
connecting in parallel the input storage element, the first auxiliary storage element and a fourth auxiliary storage element during the first time segment;
connecting in parallel the further input storage element and the fourth auxiliary storage element during the second time segment; and
connecting in parallel the input storage element, the second auxiliary storage element and the third auxiliary storage element during the second time segment.

33. The signal processing method of claim 31, wherein providing the input signal comprises amplifying a signal received by an antenna or by an input interface.

34. The signal processing method of claim 31, wherein providing the input signal comprises deriving a current signal from a voltage signal.

35. The signal processing method of claim 31, wherein a respective duration of the first and the second time segment depends on the reference clock signal.

36. The signal processing method of claim 31, wherein the first and the second time segment temporally alternately succeed one another.

* * * * *

UNITED STATES PATENT AND TRADEMARK OFFICE
CERTIFICATE OF CORRECTION

PATENT NO. : 7,495,595 B2
APPLICATION NO. : 11/742307
DATED : February 24, 2009
INVENTOR(S) : Josef Zipper et al.

It is certified that error appears in the above-identified patent and that said Letters Patent is hereby corrected as shown below:

Title Page; item (75);
In the Inventors Section; please replace "Joseph Zipper" with --Josef Zipper--

Column 4, equation 2; please replace " $A_{A1} = \dfrac{C_{A12}}{C_{11} + C_{A12}} \cdot (Q_{1N} + Q_{1R} + Q_{A1R})$ " with -- $Q_{A1} = \dfrac{C_{A12}}{C_{11} + C_{A12}} \cdot (Q_{1K} + Q_{1R} + Q_{A1R})$ --

Column 8, equation 8; please replace

" $NTF(z) = \dfrac{Q_C}{Q_R} = \dfrac{z^2 + (a-b-1) \cdot z + b - a}{z^2 + (b \cdot w1 - b + a - 1) \cdot z + (a-1) \cdot b.w1 + a \cdot b \cdot w2 + b - a}$ "

with

-- $NTF(z) = \dfrac{Q_O}{Q_R} = \dfrac{z^2 + (a-b-1) \cdot z + b - a}{z^2 + (b \cdot w1 - b + a - 1) \cdot z + (a-1) \cdot w1 + a \cdot b \cdot w2 + b - a}$ --

Signed and Sealed this

Seventh Day of July, 2009

JOHN DOLL
*Acting Director of the United States Patent and Trademark Office*